(12) United States Patent
Hsieh et al.

(10) Patent No.: US 9,620,582 B2
(45) Date of Patent: Apr. 11, 2017

(54) METAL-INSULATOR-METAL (MIM) CAPACITORS AND FORMING METHODS

(71) Applicant: Taiwan Semiconductor Manufacturing Co., Ltd., Hsin-Chu (TW)

(72) Inventors: Ching-Pei Hsieh, Kaohsiung (TW); Chern-Yow Hsu, Chu-Bei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/606,265

(22) Filed: Jan. 27, 2015

(65) Prior Publication Data

US 2016/0218172 A1    Jul. 28, 2016

(51) Int. Cl.
*H01L 49/02*   (2006.01)
(52) U.S. Cl.
CPC .................................. *H01L 28/90* (2013.01)
(58) Field of Classification Search
None
See application file for complete search history.

(56) References Cited

U.S. PATENT DOCUMENTS

| 7,821,051 | B2 | 10/2010 | Yang et al. |
| 7,880,268 | B2 | 2/2011 | Cremer et al. |
| 8,815,679 | B1* | 8/2014 | Yen .................. H01L 28/75 257/E21.021 |
| 2005/0112836 | A1 | 5/2005 | Kim et al. |
| 2015/0187864 | A1* | 7/2015 | Chang ................. H01L 29/1608 257/532 |

FOREIGN PATENT DOCUMENTS

WO    2005055292 A1    6/2005

* cited by examiner

*Primary Examiner* — Fernando L Toledo
*Assistant Examiner* — Valerie N Newton
(74) *Attorney, Agent, or Firm* — Eschweiler & Potashnik, LLC

(57) ABSTRACT

The present disclosure relates a metal-insulator-metal (MIM) capacitor. In some embodiments, the MIM capacitor has a capacitor bottom metal (CBM) electrode arranged over a semiconductor substrate. The MIM capacitor has a high-k dielectric disposed over the CBM electrode and a capacitor top metal (CTM) electrode arranged over the high-k dielectric layer. The MIM capacitor has a dummy structure that is disposed vertically over the high-k dielectric layer and laterally apart from the CTM electrode. The dummy structure includes a conductive body having a same material as the CTM electrode.

20 Claims, 5 Drawing Sheets

METAL-INSULATOR-METAL (MIM) CAPACITORS AND FORMING METHODS

BACKGROUND

A capacitor is a passive two-terminal electrical device used to store energy within an electric field. A capacitor contains at least two electrodes separated by a dielectric layer. A capacitance of a capacitor is proportional to an area between the electrodes, and inversely proportional to a distance between them (e.g., a thickness of the dielectric layer). Accordingly, the capacitance of a capacitor can be increased by increasing the area of the electrodes, and/or by decreasing the distance between them.

A metal-insulator-metal (MIM) capacitor is a kind of capacitor commonly used in integrated circuits (ICs). MIM capacitors usually comprise a dielectric material arranged between electrodes comprising metal structures disposed within a back-end-of-the-line (BEOL) metal stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
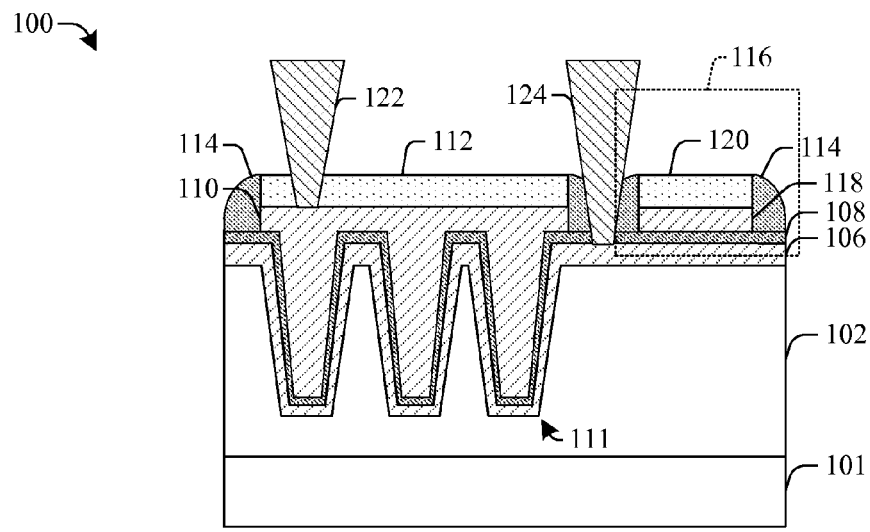
FIG. 1A illustrates a cross-sectional view of some embodiments of a metal-insulator-metal (MIM) capacitor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The semiconductor industry has continually decreased the size of integrated chip components to improve the performance and to decrease the power of integrated chips. In the case of a MIM (metal-insulator-metal) capacitor, the decrease in size of integrated chip components also decreases the capacitance or energy that the MIM capacitor is able to store. This is because as the size of integrated chip components shrinks, the size of the capacitor electrodes also shrinks. Since the capacitance of a MIM capacitor is proportional to the area of the electrodes, the decrease in electrode size also results in a decrease in capacitance of the MIM capacitor. The decrease in capacitance makes it difficult to meet the device specifications used in today's integrated chips.

Accordingly, the present disclosure relates to an improved MIM (metal-insulator-metal) capacitor structure, and associated processing methods, that provides a relatively large capacitance value while consuming a relatively small chip area. In some embodiments, the MIM capacitor comprises a capacitor bottom metal (CBM) electrode disposed over a semiconductor substrate. A high-k dielectric layer is disposed over the CBM electrode, and a capacitor top metal (CTM) electrode is disposed over the high-k dielectric layer. In some embodiments, the CBM and CTM electrodes comprise "zigzag" shapes that increase an area between the CBM and CTM electrodes. The MIM capacitor can further comprise a dummy structure disposed vertically over the high-k dielectric layer and laterally apart from the CTM electrode. The dummy structure can comprise a conductive body having a same material as the top electrode, which is used as a self-aligned mask to eliminate a photomask typically used in patterning the CBM electrode from the manufacturing process and to improve the critical dimension (CD) control of the CBM electrode.

FIG. 1A shows a cross-sectional view of a metal-insulator-metal (MIM) capacitor 100 according to some embodiments.

The MIM capacitor 100 comprises a capacitor bottom metal (CBM) electrode 106 disposed over a dielectric material 102 overlying a semiconductor substrate 101. The CBM electrode 106 is vertically separated from a capacitor top metal (CTM) electrode 110 by a high-k dielectric layer 108.

In some embodiments, the CBM electrode 106 comprises a conductive material disposed within one or more trenches 111 in the dielectric material 102. The one or more trenches 111 vertically extend from an upper surface 102s of the dielectric material 102 to a position within the dielectric material 102. Arranging the conductive material of the CBM electrode 106 within the one or more trenches 111 causes the CBM electrode 106 to have a shape that changes between different vertical positions, so as to give the CBM electrode 106 a "zigzag" or winding shape that varies in height as a function of lateral position. The high-k dielectric layer 108 is conformally disposed onto upper surfaces and along sidewalls of the CBM electrode 106, so as to also have a "zigzag" shape. A CTM electrode 110 is disposed within the one or more trenches 111 at positions laterally arranged between side surfaces of the one or more trenches 111 and laterally extending over an upper surface of the high-k dielectric layer 108. The CTM electrode 110 has a thickness that varies as a function of lateral position. A CTM contact via 122 can extend vertically through a CTM mask 112 to an upper surface of the CTM electrode 110.

The "zigzag" shapes of the CBM electrode 106 increases the surface area between the CBM electrode 106 and the CTM electrode 110 without increasing the surface area of the semiconductor substrate 101 used by the MIM capacitor 100 (i.e., without increase an area of the semiconductor substrate 101 over which the MIM capacitor 100 is arranged). This is because the area between the CBM electrode 106 and the CTM electrode 110 has a vertical component (along sidewalls of the trenches 111) and a lateral component (along a top surface of the dielectric material 102). By increasing the surface area between the CBM electrode 106 and the CTM electrode 110, the capacitance of the MIM capacitor 100a is increased without increasing the area of the semiconductor substrate 101 that is used by the MIM capacitor 100.

In some embodiments, a dummy structure 116 is disposed over the high-k dielectric layer 108 and the CBM electrode 106. The dummy structure 116 is laterally apart from the CTM electrode 110. The dummy structure 116 may comprise a dummy conductive body 118 and a dummy mask 120 overlying the dummy conductive body 118. The dummy conductive body 118 may have a same material as the CTM electrode 110. In some embodiments, one or more sidewall spacers 114 are disposed along sidewalls of the CTM electrode 110 and dummy structure 116. The sidewall spacers 114 may have an outer sidewall vertically aligned with sidewalls of the CBM electrode 106 and the high-k dielectric layer 108. In some embodiments, a CBM contact via 124 is disposed on an upper surface of the CBM electrode at a position between the CTM electrode 110 and the dummy structure 116.

The dummy structure 116 and the sidewalls spacer 114 act as a self-aligned mask that is used to pattern the CBM electrode 106 during formation of the MIM capacitor 100. By using the dummy structure 116 and the sidewall spacers 116 as a self-aligned mask, a photomask mask typically used in patterning the CBM electrode 106 can be eliminated from the manufacturing process and the critical dimension (CD) control of the CBM electrode 106 can be improved.

Figure 1B:
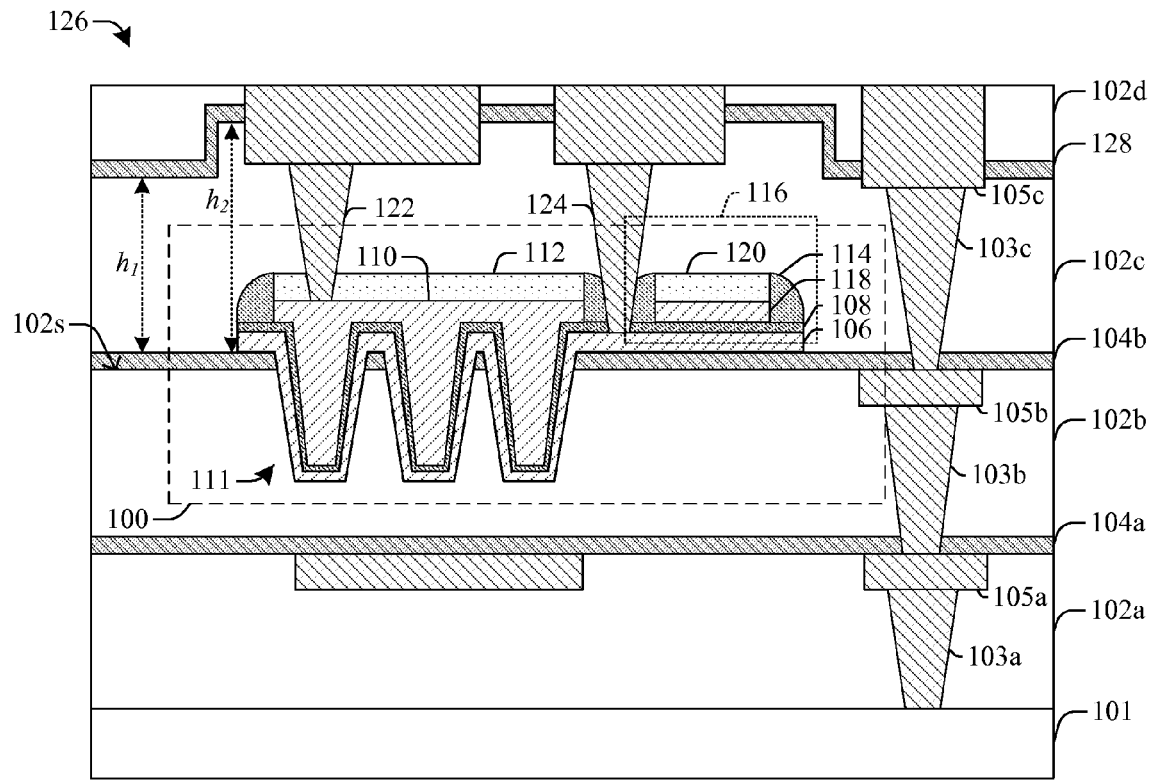
FIG. 1B illustrates a cross-sectional view of some embodiments of an integrated chip comprising a metal-insulator-metal (MIM) capacitor.

FIG. 1B shows a cross-sectional view of an integrated chip 126 comprising a metal-insulator-metal (MIM) capacitor 100 according to some embodiments.

The integrated chip 126 comprises a plurality of dielectric layers 102a-102d disposed over a semiconductor substrate 101. The plurality of dielectric layers 102a-102d may comprise one or more dielectric materials such as a low-k dielectric layer, an ultra low-k dielectric layer, an extreme low-k dielectric layer, and/or a silicon dioxide layer. One or more metal structures, such as a metal via layer 103 and or a metal wire layer 105, are respectively disposed within the plurality of dielectric layers 102a-102d. The plurality of dielectric layers 102a-102d are vertically separated by a plurality of etch stop layers (ESL) 104a, 104b, and 128. In some embodiments, the plurality of etch stop layers 104a, 104b, and 128 may comprise silicon nitride (SiN) or silicon carbide (SiC), for example.

A MIM capacitor 100 is disposed within one or more of the plurality of dielectric layers 102a-102d overlying the semiconductor substrate 101. For example, MIM capacitor 100 is disposed within dielectric layers 102b and 102c. The MIM capacitor 100b comprises a capacitor bottom metal (CBM) electrode 106 separated from a capacitor top metal (CTM) electrode 110 by a high-k dielectric layer 108.

In some embodiments, the CBM electrode 106 comprises a conformal conductive liner disposed along bottom and side surfaces of a plurality of trenches 111 located within dielectric layer 102b. In such embodiments, the CBM electrode 106 extends from over an etch stop layer 104b, through the etch stop layer 104b, to a position within the dielectric layer 102b underlying the etch stop layer 104b. In some embodiments, the CBM electrode 106 abuts a top surface of the etch stop layer 104b. The high-k dielectric layer 108 may comprise a conformal dielectric liner disposed along an upper surface of the CBM electrode 106. The CTM electrode 110 can be disposed within spaces in the plurality of trenches 111 that are not filled by the CBM electrode 106 and the high-k dielectric layer 108, and laterally set back from an edge of the CBM electrode 106. In some embodiments, a CTM mask 112 can be disposed vertically over the CTM electrode 110.

In various embodiments, the CBM electrode 106 and/or CTM electrode 110 may comprise aluminum (Al), tantalum (Ta), tantalum nitride (TaN), titanium (Ti), titanium nitride (TiN), or combinations thereof. In some embodiments, the CBM electrode 106 and/or CTM electrode 110 may have a thickness in a range of between about 100 angstroms (Å) and about 1000 Å, for example. In various embodiments, the high-k dielectric layer 108 may comprise metal oxidation composite such as titanium (Ti), platinum (Pt), ruthenium (Ru), hafnium oxide (HfOx), aluminum oxide (AlOx), tantalum oxide (TaOx), or combinations thereof. In some embodiments, high-k dielectric layer 108 may have a thickness in a range of between about 10 Å and about 100 Å, for example. In some embodiments, the CTM mask 112 may comprise silicon nitride (SiN), protective silicon oxy-nitride (PE-SiON), or silicon carbide (SiC).

In some embodiments, a dummy structure 116 is disposed over the high-k dielectric layer 108 and the CBM electrode 106. The dummy structure 116 is laterally apart from the CTM electrode 110. The dummy structure 116 may comprise a dummy conductive body 118 and a dummy mask 120 overlying the dummy conductive body 118. The dummy conductive body 118 may have a same material as the CTM electrode 110. However, the dummy conductive body 118 has a substantially flat bottom surface (in contrast to the CTM electrode 110 which has a non-planar bottom surface). In some embodiments, the dummy mask 120 may comprise silicon nitride (SiN), protective silicon oxy-nitride (PE-SiON), or silicon carbide (SiC).

In some embodiments, a non-planar etch stop layer 128 is disposed over a dielectric layer 102c surrounding the dummy structure 116. The non-planar etch stop layer 128 is arranged over etch stop layer 104b at a first height $h_1$ in areas surrounding the MIM capacitor 100b and by a second height $h_2$ in areas overlying the CTM electrode 110 and the dummy structure 116. In some embodiments, the second height $h_2$ is greater than the first height $h_1$. In some embodiments, the non-planar etch stop layer 128 may comprises silicon nitride (SiN) or silicon carbide (SiC), for example.

Sidewall spacer 114 extends upwardly along sidewalls of the CTM mask 112 and the dummy mask 120. The sidewall spacers 114 may comprise a nitride based material, such as silicon nitride (SiN), for example. In some embodiments, the sidewall spacers 114 may be disposed laterally between the CTM mask 112 and the dummy mask 120. In some embodiments, opposing sides of a CBM contact via 124 abut sidewalls spacers 114 disposed laterally between the CTM mask 112 and the dummy mask 120.

In some embodiments, the MIM capacitor 100 may be asymmetric with respect to the plurality of trenches 111. For example, the CBM electrode 106 of the MIM capacitor 100b may extend laterally outward from the plurality of trenches 111 as a first extension extending in a first direction and as a second extension extending to a greater distance in a second opposite direction. In some embodiments, the dummy structure 116 is disposed over the second extension (i.e., over the region of the CBM electrode 106 that extends outward from the trenches to a greater distance). In other embodiments (not shown), the MIM capacitor 100 may be symmetric with respect to the plurality of trenches 111.

Figure 2:
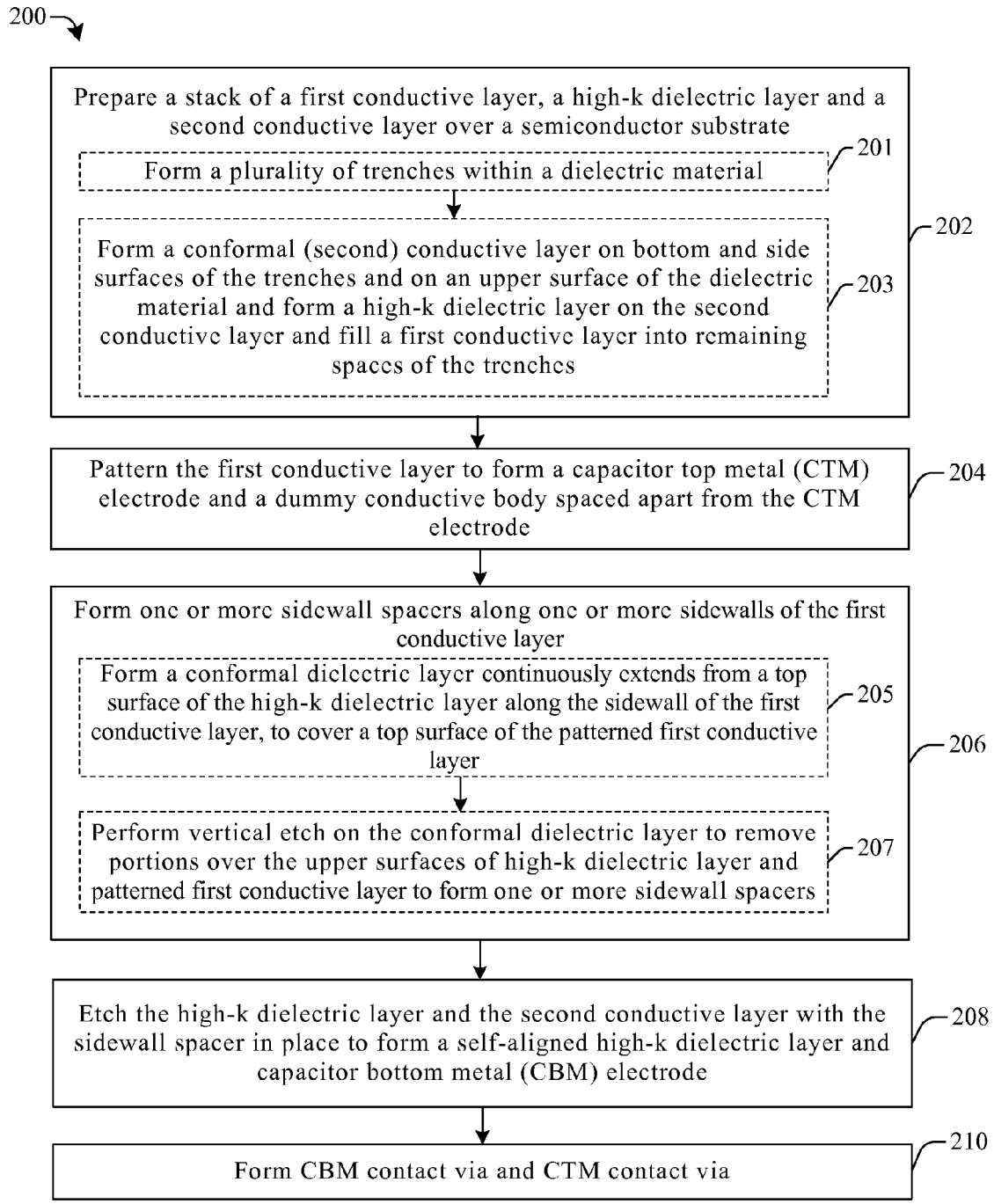
FIG. 2 illustrates a flow diagram of some embodiments of a method of forming a MIM capacitor.

FIG. 2 shows a flow diagram of a method 200 of forming a MIM capacitor in accordance with some embodiments.

While the disclosed method 200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 202, a stack of a first conductive layer, a high-k dielectric layer and a second conductive layer is prepared over a semiconductor substrate. In some embodiments, the act 202 can further comprises acts 201 and 203. At act 201, a plurality of trenches is formed within a dielectric material. At act 203, a conformal (second) conductive layer is formed on bottom and side surfaces of the trenches and on an upper surface of the dielectric material, a high-k dielectric layer is formed on the second conductive layer, and a first conductive layer is filled into remaining spaces of the trenches.

At act 204, the first conductive layer is patterned to form a capacitor top metal (CTM) electrode, and a dummy conductive body spaced apart from the CTM electrode.

At act 206, one or more sidewall spacers are formed along one or more sidewalls of the patterned first conductive layer. In some embodiments, the act 206 can further comprises acts 205 and 207. At act 205, a conformal dielectric layer is formed continuously extends from a top surface of the high-k dielectric layer along the sidewall of the patterned first conductive layer, to cover a top surface of the patterned first conductive layer. At act 207, a vertical etch is performed to the conformal dielectric layer to remove portions over the upper surfaces of high-k dielectric layer and patterned first conductive layer to form one or more sidewall spacers.

At act 208, the high-k dielectric layer and the second conductive layer are etched with the sidewall spacers in place to form self-aligned high-k dielectric layer and capacitor bottom metal (CBM) electrode.

At act 210, a CBM contact via and a CTM contact via are formed. In some embodiments, the CBM contact via is formed between the CTM electrode and the dummy conductive layer through the sidewall spacers.

FIGS. 3-10 illustrate some embodiments of cross-sectional views showing a method of forming a MIM capacitor. Although FIGS. 3-10 are described in relation to method 200, it will be appreciated that the structures disclosed in FIGS. 3-10 are not limited to such a method, but instead may stand alone as structures independent of the method.

Figure 3:
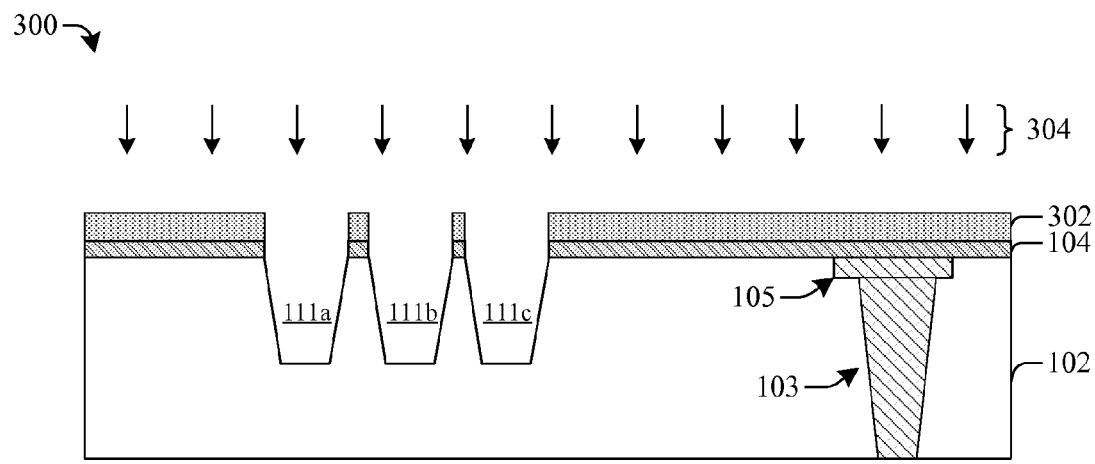
FIGS. 3-10 illustrate cross-sectional views of some embodiments showing a method of forming a MIM capacitor.

FIG. 3 illustrates some embodiments of a cross-sectional view 300 corresponding to act 201.

As shown in the cross-sectional view 300, a plurality of trenches 111, such as 111a, 111b, 111c, are formed within a dielectric material 102 and an optional etch stop layer 104. In some embodiments, the dielectric material 102 is an ILD layer surrounding one of the plurality of metal interconnect layers disposed over a semiconductor substrate (not shown), such as a metal via layer 103 and a metal wire layer 105. The dielectric material 102 may comprise a low-k dielectric layer, an ultra low-k dielectric layer, an extreme low-k dielectric layer, and/or a silicon dioxide layer. In various embodiments, the dielectric material 102 can be solid or porous low-k material.

In some embodiments, the trenches 111 are formed by selectively exposing the dielectric material 102 to an etchant 304 in areas not covered by a masking layer 302. The masking layer 302 can be nitride, such as silicon nitride, formed on the etch stop layer 104, which can be silicon carbide, but other materials are amenable. In some embodiments, the etchant 304 may comprise a dry etchant. In some embodiments, the dry etchant may have an etching chemistry comprising a fluorine species (e.g., $CF_4$, $CHF_3$, $C_4F_8$, etc.). In some embodiments, the etching chemistry may further comprise oxygen or hydrogen, for example. In other embodiments, the etchant 304 may comprise a wet etchant comprising hydroflouric acid (HF). In some embodiments, the etchant 304 may form the pluralities of trenches by performing an anisotropic etch into the dielectric material 102.

Figure 4:
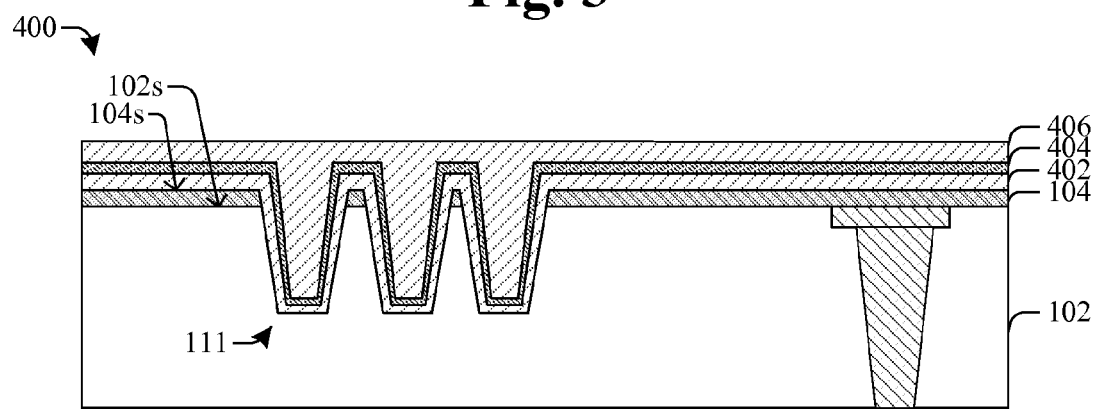

FIG. 4 illustrates some embodiments of a cross-sectional view 400 corresponding to act 203.

As shown in the cross-sectional view 400, a second conductive layer 402 is conformally formed on bottom and side surfaces of the trenches 111 and over an upper surface 102s of the dielectric material 102. In various embodiments, the second conductive layer 402 may abut an upper surface 104s of the dielectric material 102 or an upper surface of the etch stop layer 104. A high-k dielectric layer 404 is formed on the second conductive layer 402. A first conductive layer 406 is formed onto the high-k dielectric layer 404 to fill in remaining spaces of the trenches 111.

In some embodiments, the first conductive layer 406, the second conductive layer 402, and the high-k dielectric layer 404 can be formed by using a deposition technique (e.g., CVD, PE-CVD, PVD etc.). In some embodiments, a diffusion barrier liner (not shown) may be formed in the plurality of trenches 111 prior to forming the second conductive layer 402. In some embodiments, the first conductive layer 406 can be formed by evaporating or depositing a thin layer, or a seed layer, and filling the remaining space by electroplating. In some other embodiments, the first conductive layer 406 can be formed by physical vapor deposition (PVD) chemical vapor deposition (CVD), or electroless plating. A planarization process (e.g., a chemical mechanical planarization process) may subsequently be performed to achieve planar top surface for the first conductive layer 406.

Figure 5:
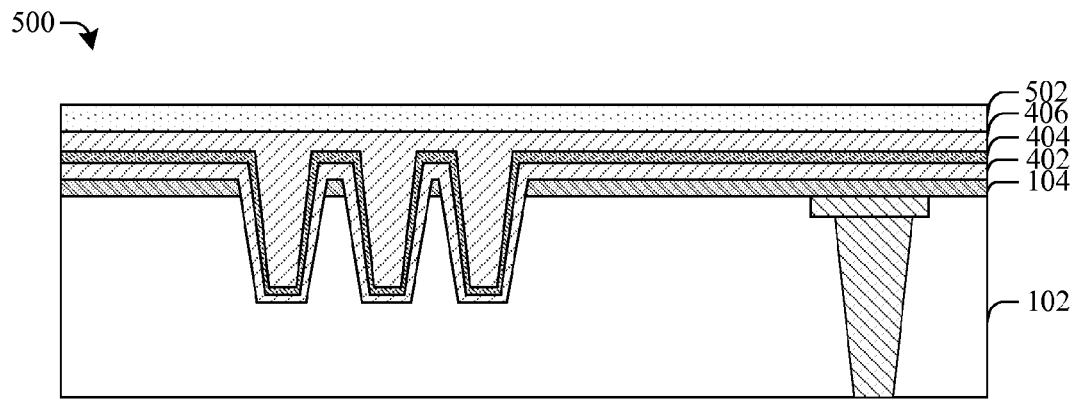
Figure 6:
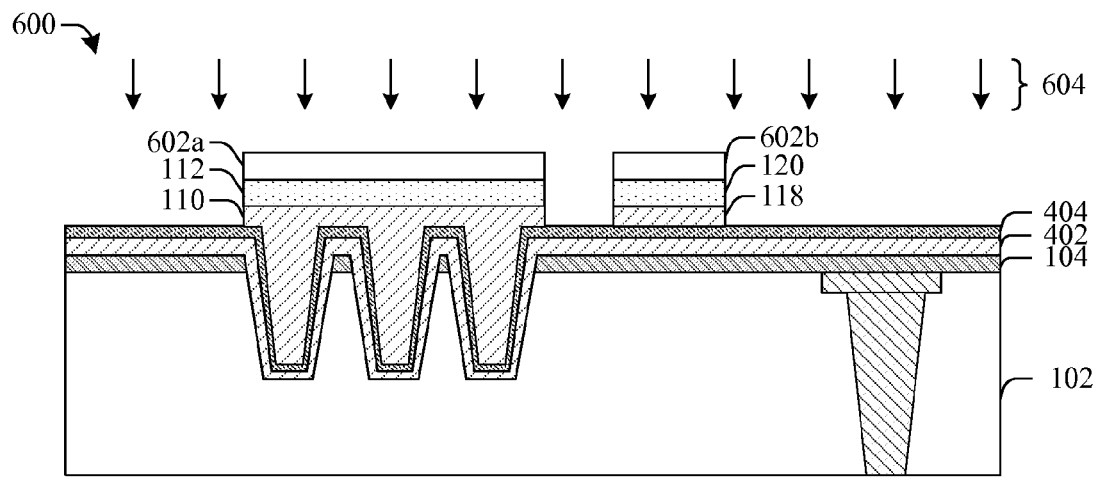

FIGS. 5-6 illustrate some embodiments of cross-sectional views, 500 and 600, corresponding to act 204.

As shown in cross-sectional view 500, a second masking layer 502 can be formed over the first conductive layer 406. In some embodiments, the second masking layer 502 can be an oxide, such as silicon dioxide, silicon nitride (SiN), protective silicon oxy-nitride (PE-SiON), or silicon carbide (SiC).

As shown in cross-sectional view 600, the first conductive layer (e.g., element 406 of FIG. 5) is patterned to according to a third masking layer 602 to form a CTM electrode 110, and a dummy conductive body 118 that is spaced apart from the CTM electrode 110. In some embodiments, the first conductive layer can be patterned by exposing the work piece to an etchant 604 in areas not covered by the third masking layer 602 (e.g., a photoresist layer comprising a first portion 602a and a second portion 602b spaced apart). After patterning, the patterned second masking layer may comprise a CTM mask 112 and a dummy mask 120 respectively overlying the CTM electrode 110 and the dummy conductive body 118. In various embodiments, the etchant 604 may comprise a wet etchant (e.g., hydroflouric acid, phosphoric acid, etc.) or a dry etchant. The third masking layer 602 is subsequently removed after patterning of the CTM electrode 110 and the dummy conductive body 118.

Figure 7:
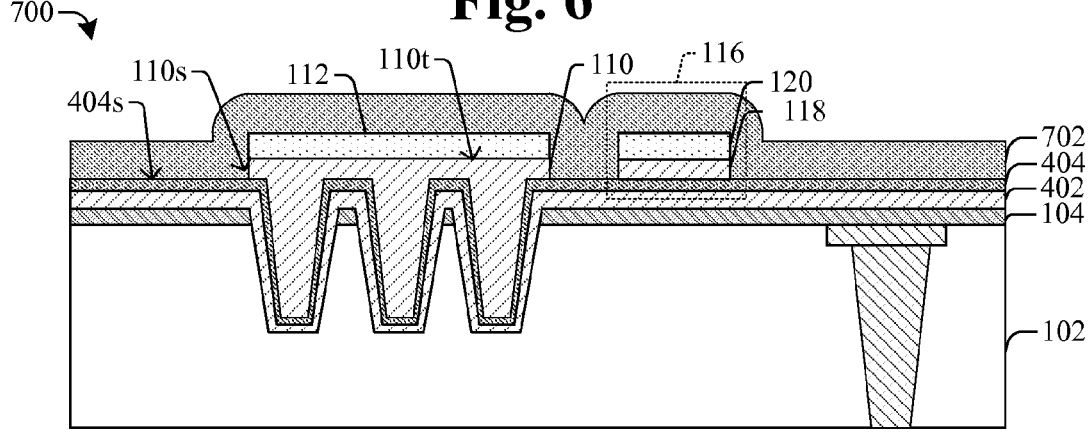

FIG. 7 illustrates some embodiments of a cross-sectional view 700 corresponding to act 205.

As shown in cross-sectional view 700, a conformal dielectric layer 702 is formed onto the substrate. The conformal dielectric layer 702 continuously extends from an upper surface 404s of the high-k dielectric layer 404, along sidewall surface 110s of the CTM electrode 110, to cover a top surface 110t of the CTM electrode 110. In some embodiments, the conformal dielectric layer 702 may also continuously extend onto sidewalls and top surfaces of the CTM mask 112 and the dummy mask 120 if applicable.

Figure 8:
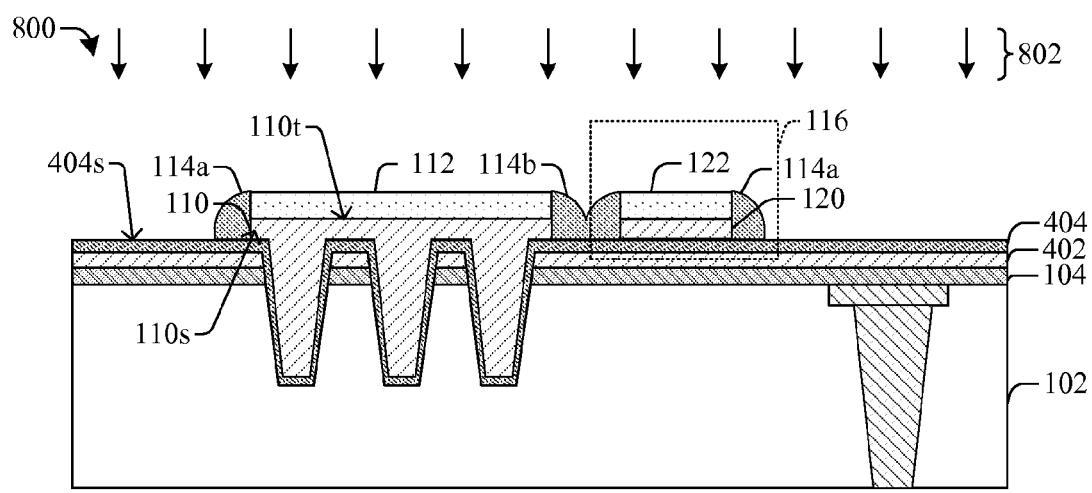

FIG. 8 illustrates some embodiments of a cross-sectional view 800 corresponding to act 207.

As shown in cross-sectional view 800, the work piece is exposed to an etchant 802 that is configured to remove the conformal dielectric layer 702 in areas over the upper surface 404s of high-k dielectric layer 404 and the top surface 110t of the CTM electrode 110. Removing the conformal dielectric layer 702 using etchant 802 forms sidewall spacers 114 along the sidewall surface 110s.

Figure 9:
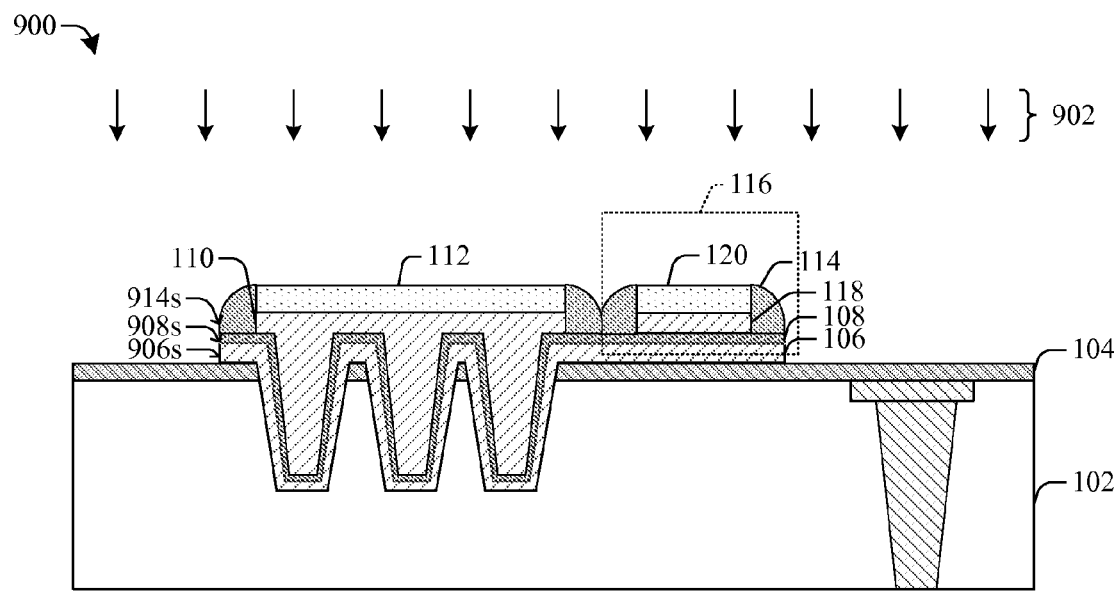

FIG. 9 illustrates some embodiments of a cross-sectional view 900 corresponding to act 208.

As shown in cross-sectional view 900, the high-k dielectric layer 404 and the second conductive layer 402 are etched by an etchant 902 with the sidewall spacers 114 in place to form self-aligned high-k dielectric layer 108 and capacitor bottom metal (CBM) electrode 106. The high-k dielectric layer 404 and the second conductive layer 402 between the CTM electrode 110 and the dummy structure 116 are protected by the sidewall spacers 114, so that portions of the high-k dielectric layer and the second conductive layer not covered by the sidewall spacers 114, the CTM mask 112 and the dummy mask 120 are removed. Sidewalls 906s, 908s, and 914s of the CBM electrode 106, the high-k dielectric layer 108 and the sidewall spacers 114 are vertically aligned. In some embodiments, the portions of the high-k dielectric layer 404 and the second conductive layer 402 are removed using a dry etching process.

Figure 10:
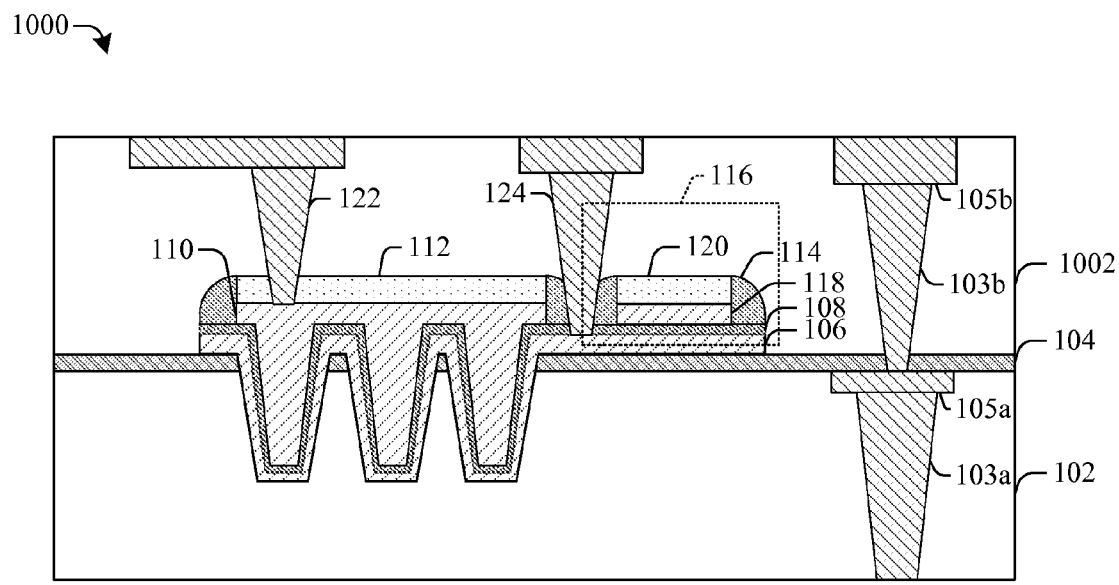

FIG. 10 illustrates some embodiments of a cross-sectional view 1000 corresponding to act 210.

As shown in cross-sectional view 1000, CTM contact via 122 and CBM contact via 124 are formed within an upper inter-level dielectric (ILD) layer 1002. The CTM contact via 124 is formed through CTM mask 112. The CBM contact via 124 is formed through the sidewall spacers 114 and the high-k dielectric layer 108 between the CTM electrode 110 and the dummy conductive body 118. In some embodiments, a metal wire layer 105b can also be formed over the CTM contact via 122 and CBM contact via 124.

In some embodiments, the CTM contact via 122 and CBM contact via 124 may be formed by etching the upper ILD layer 1002 to form openings that extends through upper ILD layer 1002 and the CTM mask 112, and that extends through upper ILD layer 1002 and the sidewall spacers 114. The openings are then filed with a metal to form the CTM contact via 122 and CBM contact via 124, which respectively extend from the CTM electrode 110 and the CBM electrode 106 to metal wire layer 105b.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

Accordingly, the present disclosure relates to an improved MIM (metal-insulator-metal) capacitor structure, and associated processing methods, that provides a relatively large capacitance value while consuming a relatively small chip area.

In some embodiments, the present disclosure relates to a metal-insulator-metal (MIM) capacitor. The MIM capacitor comprises a capacitor bottom metal (CBM) electrode disposed over a semiconductor substrate. The MIM capacitor further comprises a high-k dielectric disposed over the CBM electrode. The MIM capacitor further comprises a capacitor top metal (CTM) electrode disposed over the high-k dielectric layer. The MIM capacitor further comprises a dummy structure disposed vertically over the high-k dielectric layer and laterally apart from the CTM electrode. The dummy structure comprises a conductive body having a same material as the CTM electrode.

In another embodiment, the present disclosure relates to a metal-insulator-metal (MIM) capacitor. The MIM capacitor comprises a plurality of trenches disposed within a dielectric material overlying a semiconductor substrate. The MIM capacitor further comprises a capacitor bottom metal (CBM) electrode disposed along bottom and side surfaces of the plurality of trenches and extending laterally along an upper surface of the dielectric material. The MIM capacitor further comprises a high-k dielectric layer disposed along an upper surface of the CBM electrode. The MIM capacitor further comprises a capacitor top metal (CTM) electrode comprising a conductive body disposed within spaces in the plurality of trenches that are not filled by the CBM electrode and the high-k dielectric layer, and laterally set back from an edge of the CBM electrode.

In yet another embodiment, the present disclosure relates to a method of forming a metal-insulator-metal (MIM) capacitor. The method comprises preparing a stack over a semiconductor substrate, comprising a first conductive layer and a second conductive layer separated by a high-k dielectric layer. The method further comprises patterning the first conductive layer to form a capacitor top metal (CTM) electrode and a dummy conductive body spaced apart from the CTM electrode. The method further comprises forming one or more sidewall spacers along one or more sidewalls of the first conductive layer. The method further comprises etching the high-k dielectric layer and the second conductive layer with the sidewall spacers in place to form a self-aligned high-k dielectric and a capacitor bottom metal (CBM) electrode. The method further comprises forming CTM contact via on the CTM electrode and a CBM contact via, which extends through the sidewall spacers between the CTM electrode and the dummy conductive body.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor, comprising:
   a capacitor bottom metal (CBM) electrode disposed over a semiconductor substrate;
   a high-k dielectric layer disposed over the CBM electrode;
   a capacitor top metal (CTM) electrode disposed over the high-k dielectric layer; and
   a dummy structure disposed vertically over the high-k dielectric layer, wherein the dummy structure comprises a conductive body having a same material as the CTM electrode and laterally apart from the CTM electrode.

2. The MIM capacitor of claim 1, further comprising one or more sidewall spacers extending along sidewalls of the dummy structure and the CTM electrode, wherein sidewalls of the high-k dielectric and the CBM electrode are vertically aligned with a sidewall of the sidewall spacer.

3. The MIM capacitor of claim 2, wherein the one or more sidewall spacers comprise silicon nitride (SiN).

4. The MIM capacitor of claim 1, further comprising:
   a CBM contact via disposed on an upper surface of the CBM electrode at a position between the CTM electrode and the dummy structure; and
   a CTM contact via disposed on an upper surface of the CTM electrode.

5. The MIM capacitor of claim 1,
   wherein the CBM electrode comprises a conductive liner disposed along bottom and side surfaces of a plurality of trenches within a dielectric layer disposed over the semiconductor substrate and extending along an upper surface of the dielectric layer;
   wherein the high-k dielectric layer comprises a dielectric liner disposed along an upper surface of the CBM electrode; and
   wherein the CTM electrode is disposed in the trenches at positions laterally arranged between the side surfaces of the trenches and laterally extends along an upper surface of the dielectric layer.

6. The MIM capacitor of claim 1, further comprising:
   a CTM mask disposed on the CTM electrode;
   wherein the dummy structure further comprises a dummy mask that is disposed on the conductive body at a location laterally aligned with the CTM mask, and that comprises a same material as the CTM mask.

7. The MIM capacitor of claim 6, wherein the CTM mask comprises silicon nitride (SiN), silicon oxy-nitride (SiON), or silicon carbide (SiC).

8. The MIM capacitor of claim 1, further comprising an etch stop layer disposed between an upper surface of the semiconductor substrate and the CBM electrode.

9. The MIM capacitor of claim 8, wherein the etch stop layer comprises silicon nitride (SiN) or silicon carbide (SiC).

10. The MIM capacitor of claim 1, wherein the CTM electrode and CBM electrode comprise aluminum (Al), tantalum (Ta), tantalum nitride (TaN), titanium (Ti), titanium nitride (TiN), or combinations thereof.

11. The MIM capacitor of claim 1, wherein the high-k dielectric layer comprises titanium (Ti), platinum (Pt), ruthenium (Ru), hafnium oxide (HfOx), aluminum oxide (AlOx), tantalum oxide (TaOx), or combinations thereof.

12. A metal-insulator-metal (MIM) capacitor, comprising:
   a plurality of trenches disposed within a dielectric material overlying a semiconductor substrate;
   a capacitor bottom metal (CBM) electrode disposed along bottom and side surfaces of the plurality of trenches and extending laterally along an upper surface of the dielectric material;
   a high-k dielectric layer disposed along an upper surface of the CBM electrode; and
   a capacitor top metal (CTM) electrode comprising a conductive body disposed within spaces in the plurality of trenches that are not filled by the CBM electrode and the high-k dielectric layer, and laterally set back from an edge of the CBM electrode.

13. The MIM capacitor of claim 12, further comprising:
   a CTM mask vertically overlying the CTM electrode; and
   one or more sidewall spacers extending along sidewalls of the CTM electrode and the CTM mask.

14. The MIM capacitor of claim 13, further comprising:
   a CBM contact via vertically extending through the one or more sidewall spacers and disposed on an upper surface of the CBM electrode not covered by the CTM electrode; and
   a CTM contact via disposed on an upper surface of the CTM electrode.

15. The MIM capacitor of claim 14, further comprising:
   a dummy structure laterally spaced apart from the CTM electrode by the CBM contact via, and comprising a conductive body made of a same material as the CTM electrode and an overlying dummy mask;
   wherein sidewalls of the dummy structure laterally abut the sidewall spacer.

16. A metal-insulator-metal (MIM) capacitor, comprising:
   a dielectric layer disposed over a substrate, the dielectric layer comprising a plurality of trenches extending downwardly from an upper surface of the dielectric layer;
   a capacitor bottom metal (CBM) electrode disposed along bottom and side surfaces of the plurality of trenches and extending laterally along the upper surface of the dielectric layer;
   a high-k dielectric layer disposed along an upper surface of the CBM electrode;
   a capacitor top metal (CTM) electrode overlying the high-k dielectric layer, and laterally set back from an edge of the CBM electrode;
   a sidewall spacer having a first portion disposed along sidewalls of the CTM electrode; and
   a dummy structure disposed over the high-k dielectric layer and laterally spaced apart from the CTM electrode, wherein the dummy structure comprises a same material as the CTM electrode and has sidewalls covered by a second portion of the sidewall spacer.

17. The MIM capacitor of claim 16, further comprising:
   a CTM mask disposed on the CTM electrode; and
   a dummy mask disposed on the dummy structure.

18. The MIM capacitor of claim 16, further comprising:
a CBM contact via vertically extending through the high-k dielectric layer and in contact with the upper surface of the CBM electrode; and
a CTM contact via in contact with an upper surface of the CTM electrode.

19. The MIM capacitor of claim 16, wherein CTM electrode has a planar upper surface aligned with an upper surface of the dummy structure.

20. The MIM capacitor of claim 16, wherein the sidewall spacer has an outer sidewall aligned with outer sidewalls of the high-k dielectric layer and the CBM electrode.

* * * * *